(12) United States Patent
Ferrari et al.

(10) Patent No.: US 7,210,075 B2
(45) Date of Patent: Apr. 24, 2007

(54) PRUNABLE S-RANDOM BLOCK INTERLEAVER METHOD AND CORRESPONDING INTERLEAVER

(75) Inventors: Marco Ferrari, Milan (IT); Massimiliano Siti, S. Donato Milanese (IT); Stefano Valle, Monza (IT); Fabio Osnato, Milan (IT); Fabio Scalise, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 653 days.

(21) Appl. No.: 10/143,531

(22) Filed: May 9, 2002

(65) Prior Publication Data

US 2002/0194554 A1    Dec. 19, 2002

(30) Foreign Application Priority Data

May 10, 2001   (EP)   ................................. 01111406

(51) Int. Cl.
*G06F 11/00* (2006.01)
(52) U.S. Cl. ...................................... 714/701; 714/751
(58) Field of Classification Search ................ 714/755, 714/786, 701, 751; 711/265; 370/335
See application file for complete search history.

(56) References Cited

U.S. PATENT DOCUMENTS

| | | | |
|---|---|---|---|
| 6,023,783 A | 2/2000 | Divsalar et al. | 714/792 |
| 6,334,197 B1 * | 12/2001 | Eroz et al. | 714/701 |
| 6,484,283 B2 * | 11/2002 | Stephen et al. | 714/786 |
| 6,493,815 B1 * | 12/2002 | Kim et al. | 711/217 |
| 6,591,381 B1 * | 7/2003 | Kim et al. | 714/701 |
| 6,697,990 B2 * | 2/2004 | El-Gamal et al. | 714/755 |
| 6,772,391 B1 * | 8/2004 | Shin | 714/786 |
| 6,785,861 B2 * | 8/2004 | Scalise et al. | 714/786 |

FOREIGN PATENT DOCUMENTS

WO    WO 00/10257    2/2000

OTHER PUBLICATIONS

Dinoi et al., Design of Prunable S-random Interleavers.*
Sadjadpour et al., Interleaver Design for Turbo Codes, Nov. 10, 2000, pp. 1-18.*
Eroz, M. et al., "On the Design of Prunable Interleavers for Turbo Codes," *IEEE Vehicular Technology Conference*, vol. 2, pp. 1669-1673, May 1999.
Lee, B. et al., "Design of Swap Interleaver for Turbo Codes," *Electronics Letters*, 35(22):1939-1940, Oct. 28, 1999.

(Continued)

*Primary Examiner*—Albert Decady
*Assistant Examiner*—Mujtaba Chaudry
(74) *Attorney, Agent, or Firm*—Lisa L. Jorgenson; Robert Iannucci; Seed IP Law Group PLLC (57) ABSTRACT

A method for designing a new prunable S-random interleaver class to be used as a constituent part of turbo codes. With respect to previously proposed solutions the method has the advantage of being prunable to different block sizes while exhibiting at the same time, for any considered block size, performance comparable with the optimized "ad hoc" S-random interleavers. Another advantage is that, as for every S-random interleaver, the design rules are independent of the constituent codes and of the puncturing rate applied to the turbo code. Therefore, these interleavers potentially can find applications in any turbo code scheme that requires interleaver size flexibility and code rate versatility, thanks to the advantage of requiring a single law storage (i e., one ROM storage instead of several ROMs) from which all the others are obtained by pruning, without compromising the overall error rate performance.

18 Claims, 4 Drawing Sheets

OTHER PUBLICATIONS

Campanella, M. et al., "Simple Method for Limiting Delay of Optimised Interleavers for Turbo-Codes," *Electronics Letters*, 36(14):1216-1217, Jul. 6, 2000.

Said, F. et al., "Improving Random Interleaver for Turbo Codes," *Electronics Letters*, 35(25):2194-2195, Dec. 9, 1999.

* cited by examiner

PRUNABLE S-RANDOM BLOCK INTERLEAVER METHOD AND CORRESPONDING INTERLEAVER

BACKGROUND OF THE INVENTION

1. Field of the Invention

The present invention relates generally to the field of digital transmission systems. More specifically, it relates to the design of interleavers to be used in conjunction with error correcting codes in communication systems.

2. Description of the Related Art

Signal transmission in digital communication systems invariably occurs through noisy channels where errors are introduced. Normally, the information bits are coded (i.e., redundant bits are added with the specific code law) before transmission in order to detect and correct errors at the receiver. An interleaver device is widely adopted in coding schemes in case of burst error channels in order to randomize (ie., to spread) the location of errors thereby improving their performance. Basically, interleavers are devices taking a set of symbols and producing at their output the same set of symbols in a different order. For that reason interleavers are also introduced when the need exists of decorrelating the burst errors out of a Viterbi decoder in a concatenated codes scheme (e.g., Convolutional Codes concatenated with Reed-Solomon Codes). Interleavers find another important application as a fundamental constituent part of Turbo Codes (see, for instance, C. Berrou, A. Glavieux, P. Thitimajshima, "Near Shannon limit error-correcting coding and decoding: Turbo-codes (1)", in Proceedings 1993 Int. Conf. on Communications, (Geneva Switzerland, May 1993), pp. 1064–1070), which consist of the concatenation of two constituent convolutional codes through an interleaver. This application is of particular significance for an embodiment of the invention.

Interleavers are usually classed as block interleavers or convolutional interleavers depending on their input-output symbol flow (block wise or continuous). Several randomization or spreading laws have been developed; a concise review of most of these approaches is provided in Heegard C. and Wicker S. B., "Turbo Coding", Kluwer Academic Publisher, Boston, 1999 (Chapter 3). Since the appearance of Turbo Codes in coding theory it has been recognized that interleaver strategy plays a critical role in determining code performance. This is true for both Turbo Code classes, i.e., Parallel Concatenated Convolutional Code (PCCC) originally proposed in the above-referenced article by Berrou et al. and U.S. Pat. No. 5,446,747 as well as for Serially Concatenated Convolutional Code (SCCC) (see, for instance, S. Benedetto, D. Divsalar, G. Montorsi and F. Pollara, "Serial concatenation of interleaved codes: performance analysis, design and iterative decoding", *IEEE Transactions on Information Theory*, pp. 909–926, May 1998). In any case such interleavers must be block interleavers, as the data stream must be divided into blocks of finite size before performing the decoding operations. Their role is fundamental, in association with recursive constituent convolutional encoders, to optimize the properties of the overall code in terms of free distance and related codeword multiplicities.

According to literature, bare random interleavers on the one hand guarantee a low multiplicity for the minimum distance terms but neglect the optimization of the minimum distance itself, thus yielding asymptotically a low, though flat, error-floor (see, for instance, Dolinar S. and Divsalar D., "Weight distributions for turbo codes using random and nonrandom permutations," JPL TDA Progress Report 42–122, August 1995).

On the other hand, bare structured (deterministic) interleavers allow control of the minimum distance of the code but not of the multiplicity of the related codewords, thus providing an error floor region occurring for BER values higher with respect to the former case, but slightly decreasing vs. SNR.

Lately, pseudo-random interleavers such as S-random interleavers (see, for instance, D. Divsalar and F. Pollara, "Multiple Turbo Codes for deep-space applications", JPL TDA Progr. Rep., vol. 42–121, May 1995 and U.S. Pat. No. 6,023,783) or dithered-Golden interleavers (see, for instance, S. Crozier, J. Lodge, P. Guinand, A. Hunt, "Performance of Turbo Codes with relative prime and golden interleaving strategies", IMSC '99, Ottawa, Canada, June 1999), combining randomness properties and design criteria, have shown the best performance.

Some authors have also proposed techniques for interleaver design based on cost functions related to the component codes. Exemplary of such an approach are the works F. Daneshgaran and M. Mondin, "Design of interleavers for turbo codes based on a cost function", International Symposium on Turbo Codes & Related Topics—Brest 1997 and J. Hokfelt, O. Edfors, T. Maseng, "Interleaver design for Turbo Codes based on the performance of iterative decoding", in Proc. IEEE Int. Conf. on Communications, Vancouver, BC, June 1999. The drawback is that these solutions lead to very specific permutations, whose performance is quite sensitive to component codes and also to puncturing.

Unfortunately, these interleavers are designed for specific sizes, and several different interleaving laws need in principle to be stored for those applications that require size flexibility. A typical case is represented by flexible rate SCCCs (see, for instance, S. Benedetto and G. Montorsi, "Versatile Bandwidth-efficient Parallel and Serial Turbo-trellis-coded Modulation", $2^{nd}$ International Symposium on Turbo Codes & Related Topics—Brest 2000), where a versatile pruning algorithm applied to the inner code makes it necessary to permute blocks of different sizes. Another important case is the PCCC standardized for UMTS, where turbo interleaver design requires many different block sizes to be supported according to variable input data requirements (see, for instance, Eroz, M.; Hammons, A. R., Jr., "On the design of prunable interleavers for turbo codes" 1999 IEEE 49th Vehicular Technology Conference, Vol. 2, Page (s): 1669–1673).

One way to overcome the need of storing several interleavers is to obtain shorter block interleavers by "pruning" a "mother" interleaver with higher block size; basically, while permuting the symbols, the oversized positions are dropped (i.e., unused) as disclosed e.g., in the captioned work by S. Benedetto and G. Montorsi. This kind of operation may often destroy the interleaver properties, and hence a dramatic degradation of the performances can be expected. Conversely, for UMTS standard a new class of deterministic prunable interleavers has been proposed with the specific property of being robust under pruning as shown, e.g., in the article by Eroz et al. already referred to in the foregoing. Due to their recursive design algorithm, also interleavers as proposed in the article by F. Daneshgaran et al. referred to in the foregoing seem to maintain their properties when pruned, although this is not explicitly mentioned.

BRIEF SUMMARY OF THE INVENTION

Aspects of the present invention include a method of generating from a set of input data a set of interleaved output data by means of an interleaver law. The method includes generating a basic S-random interleaver of a basic size with a given spread, randomly inserting oversized positions in said basic interleaver, checking said spread for every insertion, thus generating a final S-random interleaver, and generating a flexible size S-random interleaver by selectively pruning said final S-random interleaver, whereby any interleaver law pruned from said final interleaver matches the spread properties of said basic interleaver.

In accordance with another aspect of the invention, the method includes generating said basic interleaver with a S-random permutation of a given basic size to be extended to an extended size, and generating an increasing natural sequence of integers from B+1 to N, where B is said basic size and N is said extended size. Another aspects includes setting M=B, K=1, and looping the following steps until K=N−B: generating said basic interleaver with a S-random permutation of the given basic size (B) to be extended to the extended size (N), and generating an increasing natural sequence of integers from B+1 to N, where B is said basic size and N is said extended size. Yet further aspects include generating a random position for inserting said oversized positions as J∈[1,M], comparing P(K) with I(L), L∈[J−S,J+S−1], stepping back to generating said random position if any of |P(K)−I(L)|<S, wherein S is said given spread, setting I(L+1)=I(L), L∈[M,M−1,M−2 . . . J], setting I(J)=P(K), and increasing M=M+1, increase K=K+1.

BRIEF DESCRIPTION OF THE SEVERAL VIEWS OF THE DRAWINGS

Embodiments of the invention will now be described, by way of example only, by referring to the annexed drawings, wherein.

DETAILED DESCRIPTION OF THE INVENTION

The disclosed embodiments of the present invention provide a new prunable S-random interleaver class that has the advantages of being prunable to different block sizes, showing at the same time, for any considered block size, performance comparable with optimized "ad hoc" S-random interleavers (which represent, from this point of view, one of the best interleaver classes available in literature).

These aspects of the invention also maintain advantages of S-random interleavers of a design independent of the constituent codes and of their puncturing rate. Therefore, these interleavers potentially can find applications in turbo code schemes that require interleaver size flexibility and code rate versatility, thanks to the advantage of requiring a single law storage from which all the others are obtained by pruning (i.e., one ROM storage instead of one RAM storage or several ROMs), without compromising the overall error rate performance.

The flexible size S-random (FS S-random) interleavers of embodiments of the invention can be seen as a special subset of S-random interleavers, with good properties under pruning. S-random interleavers are one of the best interleaver classes available in the literature as disclosed, e.g., in the articles by Dolinar et al. and Divsalar already referred to in the foregoing with their "spread" S affecting the overall code performance.

Specifically, the "spread" being equal to S means that if two input symbols j, k have distance |i−j|<S they have distance |π(i)−π(j)|>S out of the interleaver where π( ) represents the interleaver law.

In order to adapt a S-random interleaver to shorter block sizes a proposed solution is to design a mother interleaver optimized for the highest required block size and obtain shorter interleavers by pruning.

Figure 1:
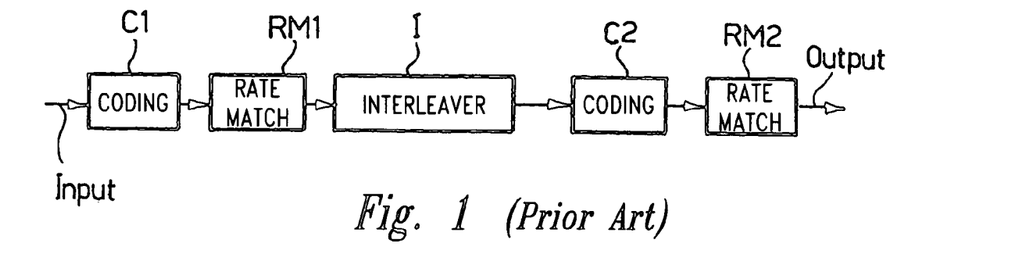
FIG. 1 is a block diagram showing a typical SCCC (Serially Concatenated Convolutional Code) arrangement.

A typical Serially Concatenated Convolutional Code (SCCC) arrangement (as disclosed e.g., in the work by S. Benedetto and G. Montorsi repeatedly referred to in the foregoing) consists of the concatenation of two convolutional coding modules C1, C2 (of rates $R_1$, $R_2$, respectively) separated by an interleaver I. The overall rate is $R=R_1R_2$. The interleaver size depends both on the block size N and on the outer code rate ($R_1$). Flexible rate schemes are obtained by puncturing both output streams (of the inner and of the outer coder) with proper rate matching blocks RM1,RM2, such as shown in FIG. 1. Changes in the puncturing rates affect the actual interleaver size.

A major concern with pruning is that one cannot guarantee that the obtained permutations have the same spread properties as the original one; hence a degradation of the code performance can occur.

Figure 2:
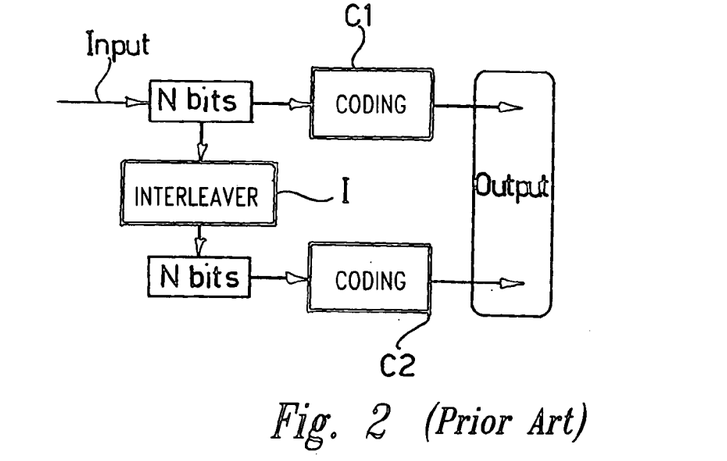
FIG. 2 is another block diagram showing a typical PCCC (Parallel Concatenated Convolutional Code) arrangement.

The Parallel Concatenated Convolutional Code (PCCC) arrangement shown in FIG. 2 refers to the necessity of using interleavers of several lengths in PCCCs like those defined in UMTS standard where different block sizes of turbo encoded data are allowed for flexibility purposes. In FIG. 2, two convolutional coding modules C1, C2 are shown generating an output code starting from an input signal. Interposed between the inputs (N bits) of the two coding modules is an interleaver I of size N.

Figure 3:
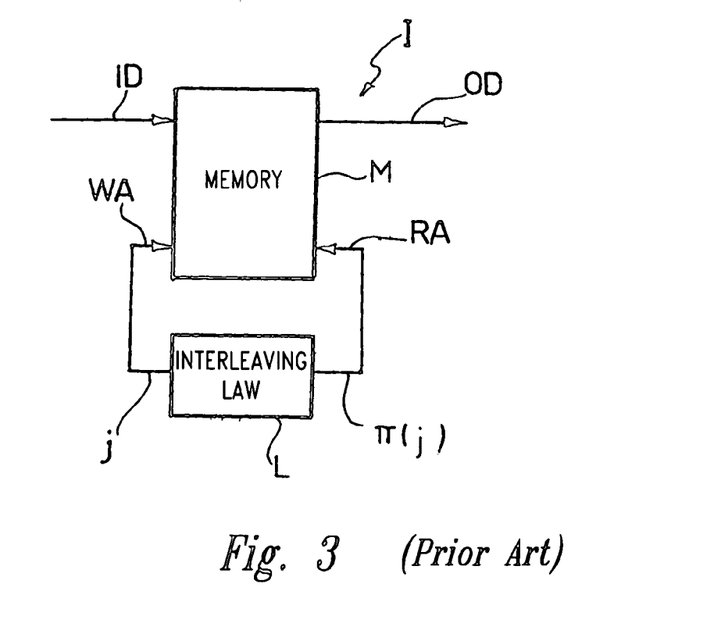
FIG. 3 is a typical arrangement for interleaver implementation.

The block diagram of FIG. 3 shows a typical interleaver arrangement where input data ID are converted to (interleaved) output data OD by storing them in a memory M. Interleaving is controlled by managing write address WA and read address RA ports of memory M based on a given interleaving law L which may be either generated on flight (e.g., by means of a deterministic law-state machine) or stored (e.g., in a ROM).

The flexible size (FS) S-random interleavers of embodiments of the invention are based on a semi-random permutation law that maintains the same spread properties when pruned to any size larger than a "basic size". They make it possible to avoid performance degradation occurring in other S-random pruned interleavers that can be found in literature, still maintaining the advantage that just one single permutation law must be stored. In fact, this class is built by starting from a S-random Interleaver of the shortest needed size ("basic size") with a given spread (S), and randomly inserting (not appending) the oversized positions; the spread S is checked for every insertion. The final result is that any interleaver law pruned from the final one matches the spread properties of the original one, at least down to the basic size. The permutation is still random-like as the S-random interleaver, because at every insertion the candidate position is chosen in a barely random way.

Figure 4:
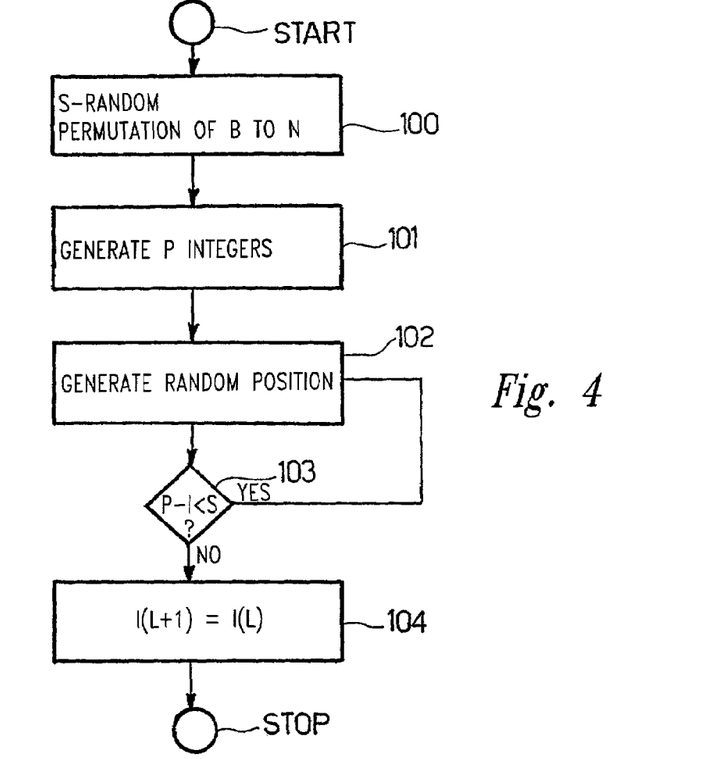
FIG. 4 is a flowchart showing the basic implementation steps of an embodiment of the invention.

The construction algorithm of the interleaver of an embodiment of the invention can be described as follows by referring to the flow-chart of FIG. 4:

start with a good S-random permutation I of the basic size B to be extended to size N (START, step 100);

generate an increasing natural sequence of P integers from B+1 to N, set M=B, K=1 and LOOP until K=N−B (step 101);

generate a random position J∈[1,M] (step 102);

compare P(K) with I(L), L∈[J−S,J+S−1] (step 103);

if any of |P(K)−I(L)|<S, step back to step 102;

set I(L+1)=I(L), L∈[M,M−1, M−2 . . . J]; set I(J)=P(K) increase M=M+1, increase K=K+1 (step 104);

END of LOOP (STOP)

This procedure can be repeated until either it is successful or up to a maximum number of tries, and then the final spread S can be decreased if this number is reached. In fact, there is no guarantee that the algorithm will be successful.

Performance

EXAMPLE 1

In this section the spread property advantages are shown which were obtained by pruning an "extended" interleaver in comparison with those derived by pruning a "S-random" interleaver.

In order to present a realistic pruning example a SCCC is considered with original rate R=4/9, punctured to three different rates (2/3, 5/6, 8/9). The balance between the two rate matching blocks is the result of an optimization (see again the article by S. Benedetto and G. Montorsi repeatedly referred to in the foregoing). Initially an information block size 4096 is considered, that leads to a maximum interleaver size 6144 (R=4/9), and intermediate operating lengths 5126 (R=2/3), 4864 (R=5/6), and 4542 (R=8/9). The second rate matching block guarantees the final desired rate.

Table A shows a comparison of the spread properties of the interleavers obtained by pruning the longest "S-random" interleaver (solution A), by pruning the "extended" interleaver built with the aforesaid method (solution B), and by using four different ad hoc "S-random" interleaver laws (solution C).

TABLE A

| Spreads Interleaver size | A Pruned (from S6144) | B Extended (from S4684) | C Specific Spread for each size |
|---|---|---|---|
| 6144 (R = 4/9) | 33 | 33 | 33 |
| 5126 (R = 2/3) | 23 | 33 | 33 |
| 4684 (R = 5/6) | 19 | 33 | 33 |
| 4542 (R = 8/9) | 18 | 30* | 30 |

*the basic size is 4684, hence down to 4542 the spread 33 is not guaranteed

In Table B, Table C, and Table D, the same comparison is made between solutions A and B for larger information block sizes (16K, 32K, 64K).

TABLE B

| N = 16K | S24579 | G24579 grown from S18150 |
|---|---|---|
| 24579 | 49 | 49 |
| 20486 | 35 | 49 |
| 18724 | 31 | 49 |
| 18150 | 30 | 49 |

TABLE C

| N = 32K | S49152 pruned | G49152 grown from S35378 |
|---|---|---|
| 49152 | 70 | 62 |
| 40208 | 49 | 62 |
| 37886 | 45 | 62 |
| 35378 | 41 | 62 |

TABLE D

| N = 64K | S98304 pruned | G98304 grown from S72166 |
|---|---|---|
| 98304 | 83 | 62 |
| 82016 | 59 | 62 |
| 77282 | 55 | 62 |
| 72166 | 48 | 62 |

Figure 5:
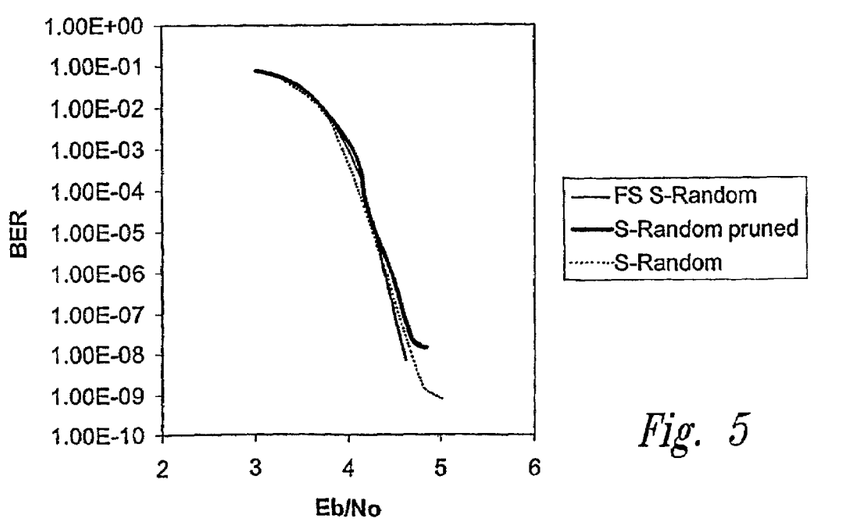
FIG. 5 is a diagram showing Bit Error Rate (BER) performance of a first coding arrangement according to an embodiment of the invention.
Figure 6:
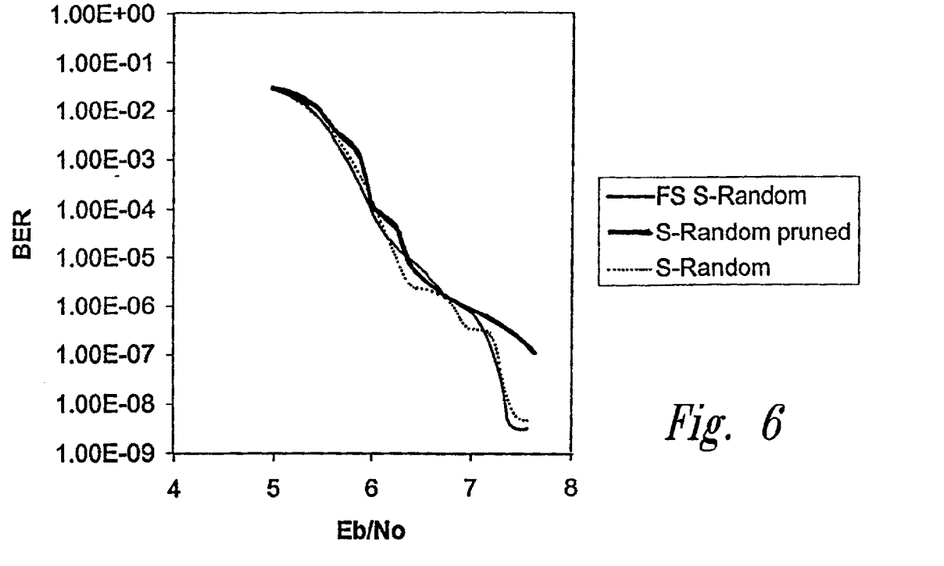
FIG. 6 is a diagram showing BER performance of another coding arrangement according to an embodiment of the invention.
Figure 7:
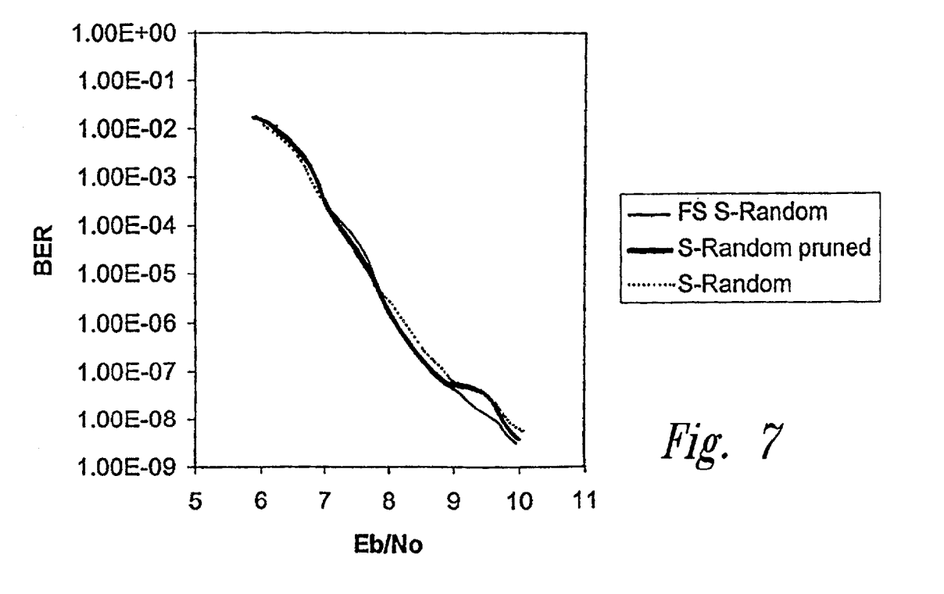
FIG. 7 is a diagram showing BER performance of still another coding arrangement according to an embodiment of the invention.

The impact of the interleaver laws on the SCCC performance is shown in FIG. 5 representing the BER curves of the same turbo code with three different interleaver solutions for the case R=2/3 and information block size 4096 bit. The BER curves are measured out of a mo-demodulation chain based on 8-PSK modulation, hence the corresponding spectral efficiency is 2.0 bit/s/Hz (reference may again be made in that respect to the article by S. Benedetto and G. Montorsi). The curves are obtained after 5 decoding iterations. FIGS. 6 and 7 show the same performance curves for the cases R=5/6(2.5 bit/s/Hz) and R=8/9 (2.666 bit/s/Hz), respectively.

The diagrams of FIGS. 5 to 7 show that there is a general advantage related to the "Extended pruned" and ad hoc "S-random" interleavers with respect to the "S-random pruned" interleaver in terms of error floor. In the extreme case (2.666 bit/s/Hz) almost no gain derives from the increased spread properties of the interleavers as all the solutions rapidly incur in the error floor, due to the fact that the severe puncture ratio (9/10) spoils most of the code benefit.

To sum up, for all the examples considered, there are basically no differences between performance with the "Extended pruned" interleaver and with the "S-random", even though the former does not require any increase of complexity with respect to the "S-random pruned".

EXAMPLE 2

In this section performance is investigated of a Parallel Concatenated (PCCC) turbo code, rate 1/3, block sizes 2048 and 1152, Q-PSK modulation, by using the "extended" interleaver and the prunable interleaver included in the UMTS standard.

In the previously captioned work by Eroz, M.; Hammons, A. R., Jr., "On the design of prunable interleavers for turbo codes"1999 IEEE 49th Vehicular Technology Conference, Vol. 2, Page(s): 484–487 a new class of prunable interleavers is discussed based on prime interleavers with the specific property of being robust under pruning. The need for pruning in UMTS comes from the need of flexibility for the block size. Interleavers of length from 40 to 8192 bits are obtained by pruning 5 different interleavers built in this way. The authors explicitly say that random interleavers, although better performing, are not designed for pruning, hence they revert on prime interleavers.

Figure 8:
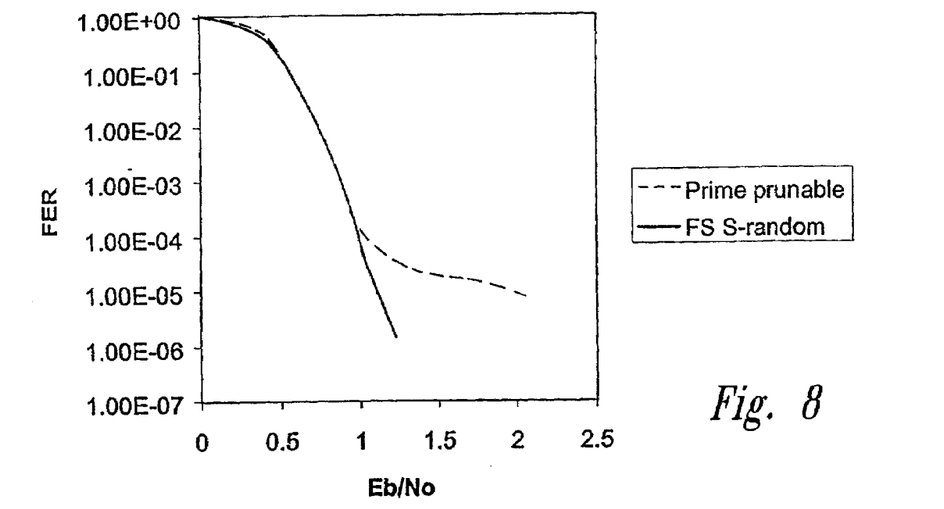
FIGS. 8 and 9 are two further diagrams showing Frame Error Rate (FER) performance of two coding arrangements according to an embodiment of the invention.

To perform a comparison we have chosen the 2048-bit interleaver and its pruned version 1152-bit long (as presented in the last-captioned work). Specifically, performance was compared of a PCCC 16 states with Q-PSK modulation working with the prunable-prime interleaver and with the extended 2048 bit-long interleaver obtained from the S-random 1152 (spread S=19). FIG. 8 demonstrates the asymptotic performance curves show that the former interleaver incurs into its floor around FER=1e−4 (Eb/N0=1 dB), while the latter does not show any error floor yet (over 750,000 frames are being considered).

Figure 9:
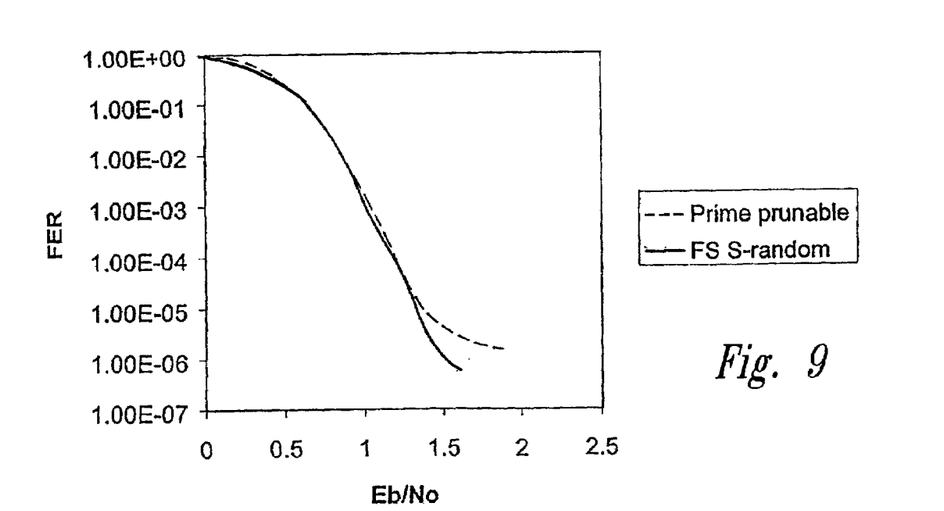

For interleavers 1152 bit long (FIG. 9) the difference is less impressive but it is still giving advantage to the extended interleaver. Data $10^{-6}$ are not exhaustive; in fact, past 1.5 dB the prunable-prime interleaver is performing even better than its mother 2048 which is unlikely. For these cases about 1.8 million frames were considered.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Of course, the basic principles of the invention remaining the same, the details and specific embodiments of the invention may vary with respect to those described in the foregoing without departing from the scope of the invention as defined in the annexed claims and the equivalents thereof.

The invention claimed is:

1. A method of generating from a set of input data a set of interleaved output data using an interleaver law, comprising:
   generating a basic S-random interleaver of a basic size with a spread (S);
   randomly inserting interleaver positions in said basic S-random interleaver;
   checking that properties of said spread (S) are maintained for every interleaver position insertion to generate a final S-random interleaver;
   generating a flexible size S-random interleaver by selectively pruning said final S-random interleaver;
   using the flexible size S-random interleaver to convert the input data to the interleaved output data; and
   communicating the interleaved output data on a data channel.

2. The method of claim 1, comprising:
   generating said basic S-random interleaver with a S-random permutation (I) of a basic size (B) to be extended to an extended size (N), and
   generating an increasing natural sequence of integers from B+1 to N, where B is said basic size and N is said extended size.

3. The method of claim 2, comprising:
   setting K=1, and
   looping said steps of claim 2 until K=N−B.

4. The method of claim 3, comprising:
   setting M=B,
   generating a random position for inserting said oversized positions as J∈[1,M],
   comparing P(K) with I(L), L∈[J−S,J+S−1],
   stepping back to generating said random position if any of |P(K)−I(L)|<S, wherein S is said spread,
   setting I(L+1)=I(L), L∈[M,M−1, M−2 . . . J],
   setting I(J)=P(K), and
   increasing M=M+1, increase K=K+1.

5. The method wherein said steps of claim 4 are repeated until either the processing is successful or up to a maximum number of iterations, then decreasing the final value of said spread (S).

6. An interleaver for generating from a set of input data a set of interleaved output using data an interleaver law, wherein said interleaver law is generated according to a method comprising:
   generating a basic S-random interleaver of a basic size with a spread (S),
   randomly inserting interleaver positions in said basic S-random interleaver,
   checking that properties of said spread (S) are maintained for every interleaver position insertion to generate a final S-random interleaver, and
   generating a flexible size S-random interleaver by selectively pruning said final S-random interleaver.

7. The interleaver of claim 6 wherein said method for generating said interleaver law comprises:
   generating said basic S-random interleaver with a S-random permutation (I) of a basic size (B) to be extended to an extended size (N), and
   generating an increasing natural sequence of integers from B+1 to N, where B is said basic size and N is said extended size.

8. The interleaver of claim 7 wherein said method for generating said interleaver law comprises:
   setting K=1, and
   looping said steps of claim 7 until K=N−B.

9. The interleaver of claim 8 wherein said method for generating said interleaver law comprises:
   setting M=B,
   generating a random position for inserting said oversized positions as J∈[1,M],
   comparing P(K) with I(L), L∈[J−S,J+S−1],
   stepping back to generating said random position if any of |P(K)−I(L)|<S, wherein S is said spread,
   setting I(L+1)=I(L), L∈[M,M−1, M−2 . . . J],
   setting I(J)=P(K), and
   increasing M=M+1, increase K=K+1.

10. The interleaver of claim 9 wherein said method for generating said interleaver law comprises repeating the steps of claim 9 until either the processing is successful or up to a maximum number of iterations, then decreasing said spread (S).

11. The interleaver of claim 6, comprising means for generating said interleaver law.

12. The interleaver of claim 6 wherein said means for generating said interleaver law comprise a deterministic law state machine.

13. The interleaver of claim 6 wherein the interleaver comprises a memory for storing said interleaver law.

14. The interleaver of claim 9, wherein said memory comprises a ROM.

15. A system of generating from a set of input data a set of interleaved output data, the system comprising:
   means for generating a basic S-random interleaver of a basic size with a spread (S);
   means for randomly inserting oversized positions in said basic S-random interleaver;

means for checking that properties of said spread (S) are maintained for every insertion to generate a final S-random interleaver;

means for generating a flexible size S-random interleaver by selectively pruning said final S-random interleaver, wherein the flexible size S-random interleaver is used to convert the input data to the interleaved output data; and means for communicating the interleaved output data on a data channel.

16. The system of claim 15, comprising:

means for generating said basic S-random interleaver with an S-random permutation (I) of a basic size (B) to be extended to an extended size (N), and means for generating an increasing natural sequence of integers from B+1 to N, where B is said basic size and N is said extended size.

17. The system of claim 16, comprising:

means for setting K=1, and means for looping said steps of claim 16 until K=N−B.

18. The system of claim 17, comprising:

means for setting M=B, means for generating a random position for inserting said oversized positions as J$\epsilon$[1,M], means for comparing P(K) with I(L), L$\epsilon$[J−S,J+S−1], means for stepping back to generating said random position if any of |P(K)−I(L)|<S, wherein S is said spread, mean for setting I(L+1)=I(L), L$\epsilon$[M,M−1,M−2 . . . J], means for setting I(J)=P(K), and means for increasing M=M+1, increase K=K+1.

* * * * *

UNITED STATES PATENT AND TRADEMARK OFFICE
CERTIFICATE OF CORRECTION

PATENT NO. : 7,210,075 B2 Page 1 of 1
APPLICATION NO. : 10/143531
DATED : April 24, 2007
INVENTOR(S) : Ferrari et al.

It is certified that error appears in the above-identified patent and that said Letters Patent is hereby corrected as shown below:

Column 8
Line 12, the section "output using data" should read as -- output data using --

Signed and Sealed this

Tenth Day of June, 2008

JON W. DUDAS
*Director of the United States Patent and Trademark Office*